(12) United States Patent
Chen

(10) Patent No.: US 7,550,668 B2
(45) Date of Patent: Jun. 23, 2009

(54) ELECTRONIC DEVICE WITH ROTATABLE SUPPORTING MEMBER

(75) Inventor: Wei-Hsi Chen, Tu-Cheng (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 568 days.

(21) Appl. No.: 11/321,249

(22) Filed: Dec. 29, 2005

(65) Prior Publication Data

US 2006/0285307 A1    Dec. 21, 2006

(30) Foreign Application Priority Data

Jun. 18, 2005    (CN)    ......................... 2005 1 0035446

(51) Int. Cl.
*H02G 3/08*    (2006.01)

(52) U.S. Cl. .................... 174/50; 174/520; 174/559; 174/562; 361/683; 361/752; 248/346.01; 248/188.8

(58) Field of Classification Search .................. 174/50, 174/53, 57, 58, 17 R, 520, 535, 559–562; 220/3.2–3.9, 4.02; 439/535, 76.1, 76.2, 131, 439/534; 361/797, 796, 752, 730, 724, 683; 248/346.01, 349.1, 158.8, 188.8

See application file for complete search history.

(56) References Cited

U.S. PATENT DOCUMENTS

| | | | | |
|---|---|---|---|---|
| 5,388,792 | A * | 2/1995 | Hastings et al. | .......... 248/188.8 |
| 5,955,700 | A * | 9/1999 | Slipy et al. | .................... 174/50 |
| 6,311,941 | B1 * | 11/2001 | Feldmeyer | ............... 248/188.8 |
| 6,603,656 | B2 * | 8/2003 | Cho et al. | .................... 361/683 |
| 7,269,001 | B2 * | 9/2007 | Huang | ......................... 361/683 |
| 7,328,880 | B2 * | 2/2008 | Helot et al. | ............ 248/346.01 |

\* cited by examiner

*Primary Examiner*—Angel R Estrada

(57) ABSTRACT

An electronic device includes a case (100) and a supporting member (40). The case includes a cover (10), a base (20), and a receiving member (30) received between the cover and the base. The cover includes a first bottom wall (12), and the base includes a second bottom wall (22). A receiving recess (144) is formed in the first and second bottom walls. A retaining portion (32) is formed in the receiving member, and received in the receiving recess. The retaining portion includes at least one slot (328). The supporting member is mounted to the retaining portion, and includes at least one locating portion (426) slideable in the slot. Thereby, when the electronic device is in a horizontal position, the supporting member is fully received in the receiving recess of the case; when the electronic device is in an upright position, the supporting member is perpendicular to the receiving recess of the case.

17 Claims, 6 Drawing Sheets

ELECTRONIC DEVICE WITH ROTATABLE SUPPORTING MEMBER

BACKGROUND

1. Field of the Invention

The present invention pertains to electronic devices, and particularly to an electronic device with a rotatable supporting member.

2. General Background

Electronic devices such as access points (AP), modems, and so on, are gaining in popularity. Many of these electronic devices can be stationed in an upright position or in a horizontal position. When an electronic device needs to be stationed in an upright position, in general a supporting member must be provided in order to prevent the electronic device from falling out of position. Conventionally, a single supporting member is used for supporting the electronic device. However, the supporting member and the electronic device are not integrated, which can lead to problems in packaging or transportation. Furthermore, the separate supporting member is liable to be misplaced. Some conventional devices have equipped an attachable supporting member, however, their structures are usually complicated and difficult to manufacture, especially in the molding process.

Therefore, a heretofore unaddressed need exists in the industry to resolve the aforementioned deficiencies and inadequacies.

SUMMARY

In a preferred embodiment, an electronic device comprises a case and a supporting member. The case comprises a cover, a base, and a receiving member received between the cover and the base. The cover comprises a first bottom wall, and the base comprises a second bottom wall. A receiving recess is formed in the first and second bottom walls. A retaining portion is formed in the receiving member, and is received in the receiving recess. The retaining portion comprises at least one slot. The supporting member has posts formed thereon for greater stability, and is mounted to the retaining portion. The supporting member comprises at least one locating portion slideable in the slot.

Compared with a conventional electronic device, the electronic device of the preferred embodiment has the following advantages. Firstly, when the electronic device is in a horizontal position, the supporting member is fully received in the receiving recess of the case. Thus the electronic device is more aesthetically pleasing and compact, and the transportation and packaging of the electronic device is easier. Secondly, when the electronic device is stood in an upright position on a surface, the supporting member is perpendicular to the receiving recess of the case. Thereby, the electronic device is supported on the surface at several points thereof, and is thus stably maintained in the upright position. Thirdly, the posts of the supporting member can prevent the supporting member from sliding on the surface, further contributing to the stability of the electronic device in the upright position.

Other advantages and novel features will become more apparent from the following detailed description when taken in conjunction with the accompanying drawings, in which:

DETAILED DESCRIPTION OF THE EMBODIMENTS

Figure 1:
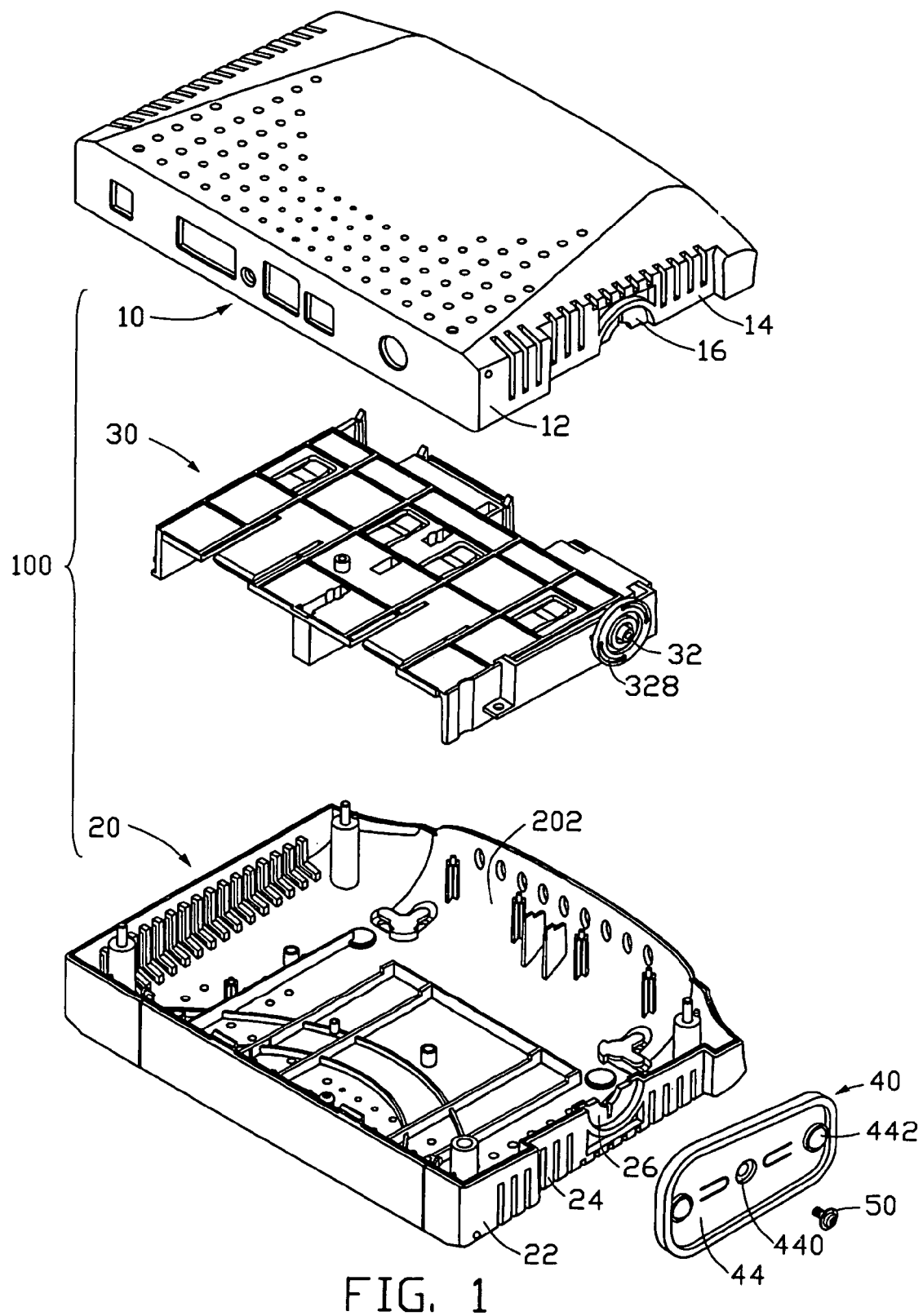
FIG. 1 is an exploded, isometric view of an electronic device in accordance with a preferred embodiment of the present invention, the electronic device comprising a cover, a receiving member, a base, a supporting member and a fastener.

Referring to FIG. 1, an electronic device in accordance with the preferred embodiment of the present invention comprises a case 100 and a supporting member 40. The case 100 comprises a cover 10, a base 20, and a receiving member 30. The electronic device may for example be an access point (AP), a modem, and so on.

Figure 2:
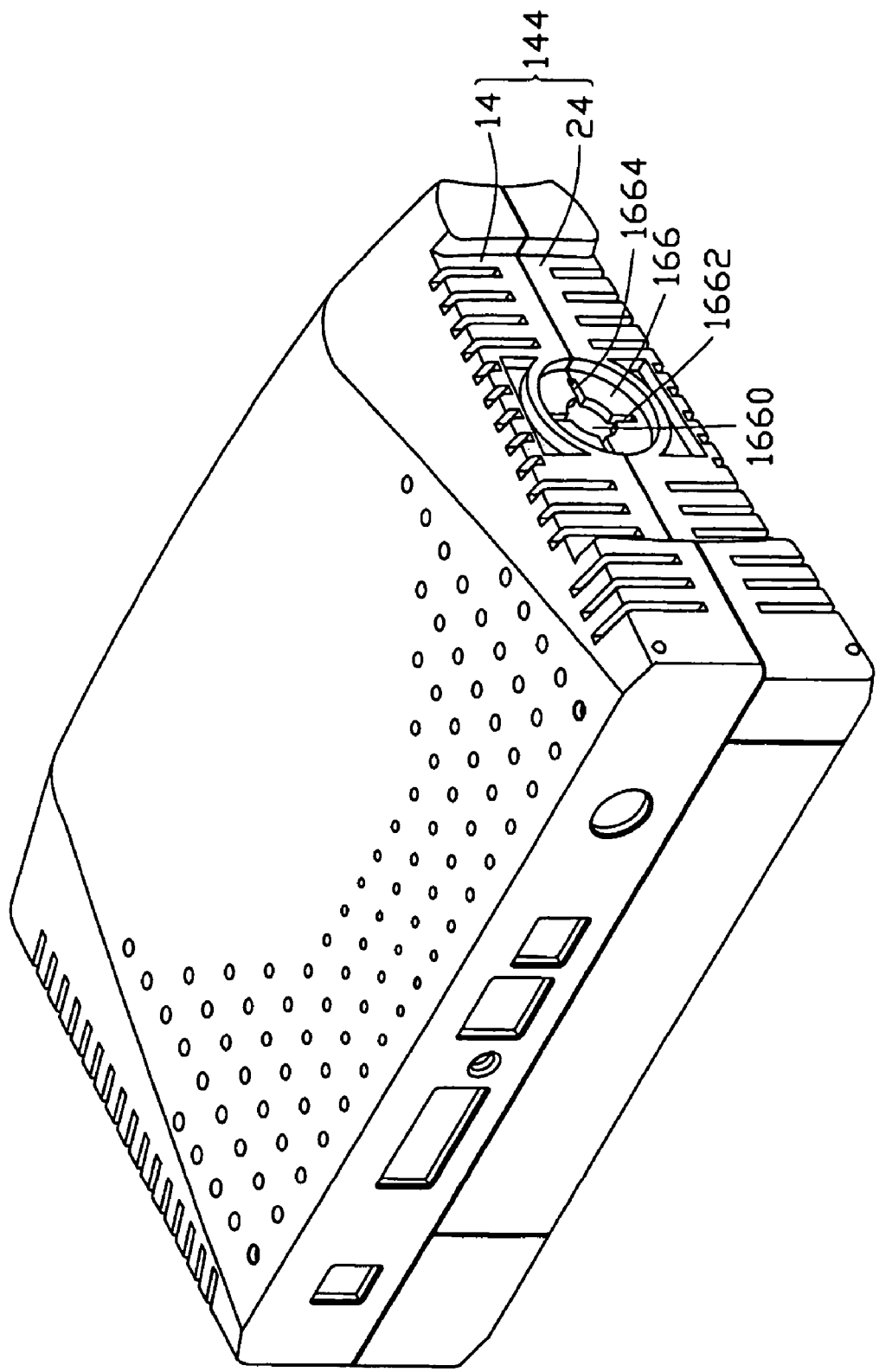
FIG. 2 is an assembled view of the cover, the receiving member and the base of the electronic device of FIG. 1.

Referring also to FIG. 2, the cover 10 can be installed on the base 20. The cover 10 comprises a first bottom wall 12. An elongate first recess 14 is defined in the first bottom wall 12. A first semicircular receiving portion 16 is defined in the first bottom wall 12 at a middle of the first recess 14.

The base 20 comprises a second bottom wall 22 and a chamber 202. The receiving member 30 is received in the chamber 202. In alternative embodiments of the present invention, the chamber 202 can be defined in the cover 10, or can be cooperatively defined by the cover 10 and the base 20. The second bottom wall 22 defines an elongate second recess 24. The first recess 14 and the second recess 24 cooperatively form a receiving recess 144, which is for receiving the supporting member 40. A second semicircular receiving portion 26 is defined in the second bottom wall 22 at a middle of the second recess 24. The first and second semicircular receiving portions 16, 26 cooperatively form a receiving portion 166. A receiving hole 1660, which is a through hole, is defined in a center of the receiving portion 166. A half of the receiving hole 1660 is located in the first receiving portion 16, and the other half of the receiving hole 1660 is located in the second semicircular receiving portion 26. The receiving portion 166 comprises a pair of aligned, vertical first slots 1662, and a pair of aligned, horizontal second slots 1664. The first and second slots 1662, 1664 communicate with the receiving hole 1660.

Figure 3:
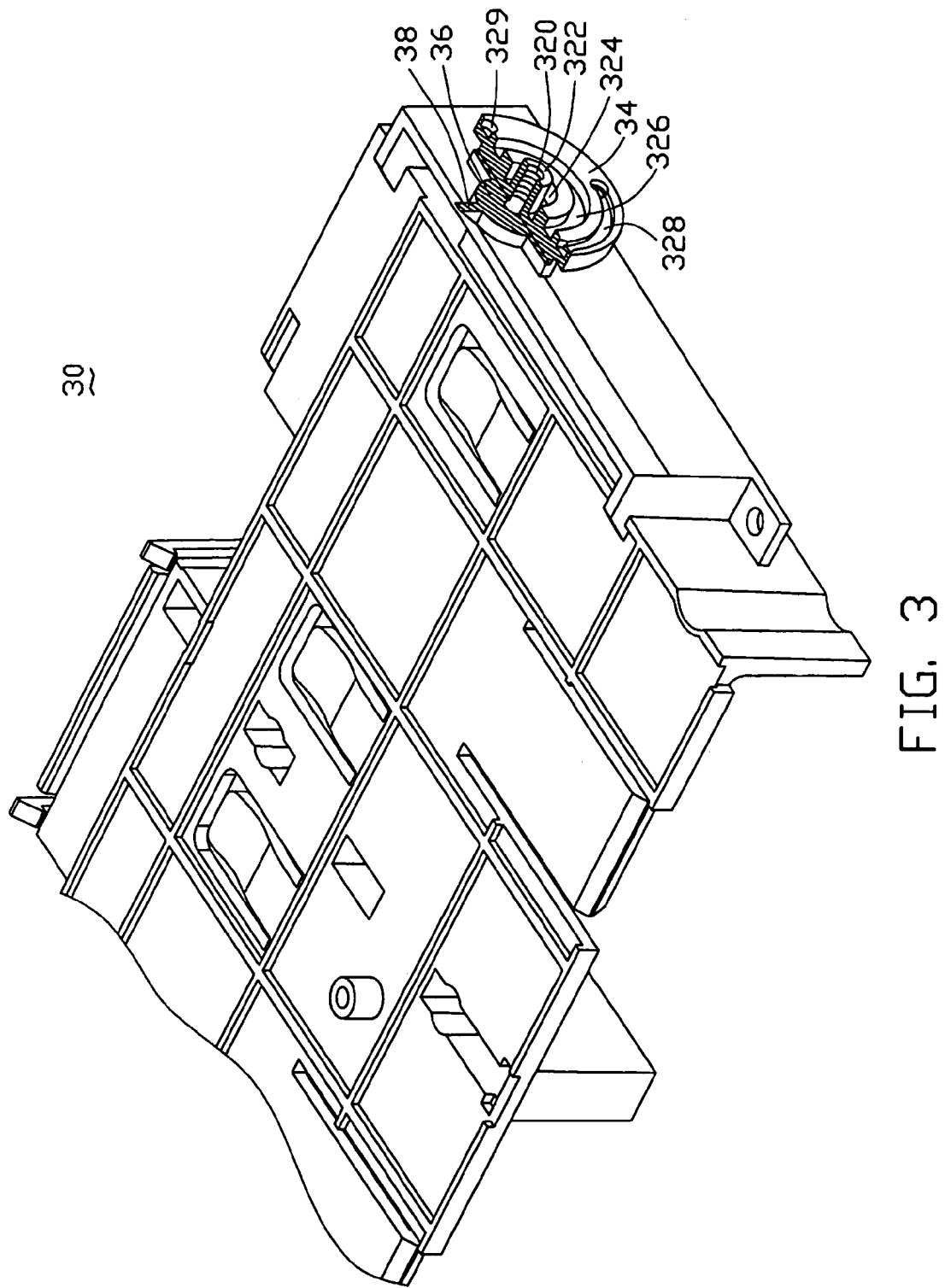
FIG. 3 is an enlarged, partly cut-away view of the receiving member of the electronic device of FIG. 1.

Referring to FIGS. 1 and 3, the receiving member 30 comprises a retaining portion 32 extending from a sidewall thereof. The retaining portion 32 comprises a circular socket 34, a neck 36, and a plurality of ribs 38. The neck 36 connects the socket 34 with the sidewall of the receiving member 30. A diameter of the neck 36 is slightly larger than that of the receiving hole 1660, and is smaller than that of the socket 34. The ribs 38 are located at a periphery of the neck 36, and can be received in the first and second slots 1662, 1664. The socket 32 comprises a post 322 projecting from a center thereof, a first circular groove 324, a second circular groove 326, and a pair of curved slots 328. The second groove 326 is located between the first groove 324 and each of the slots 328. The post 322 and the neck 36 are coaxial, and a diameter of the post 322 is smaller than that of the neck 36. A threaded hole 320 is defined in a center of the post 322. A depth of the second groove 326 is slightly greater than that of each of the slots 328, and smaller than that of the first groove 324. A pair of blind holes 329 is defined in opposite ends of each of the slots 328. A depth of each of the blind holes 329 is slightly greater than that of each of the slots 328.

Figure 4:
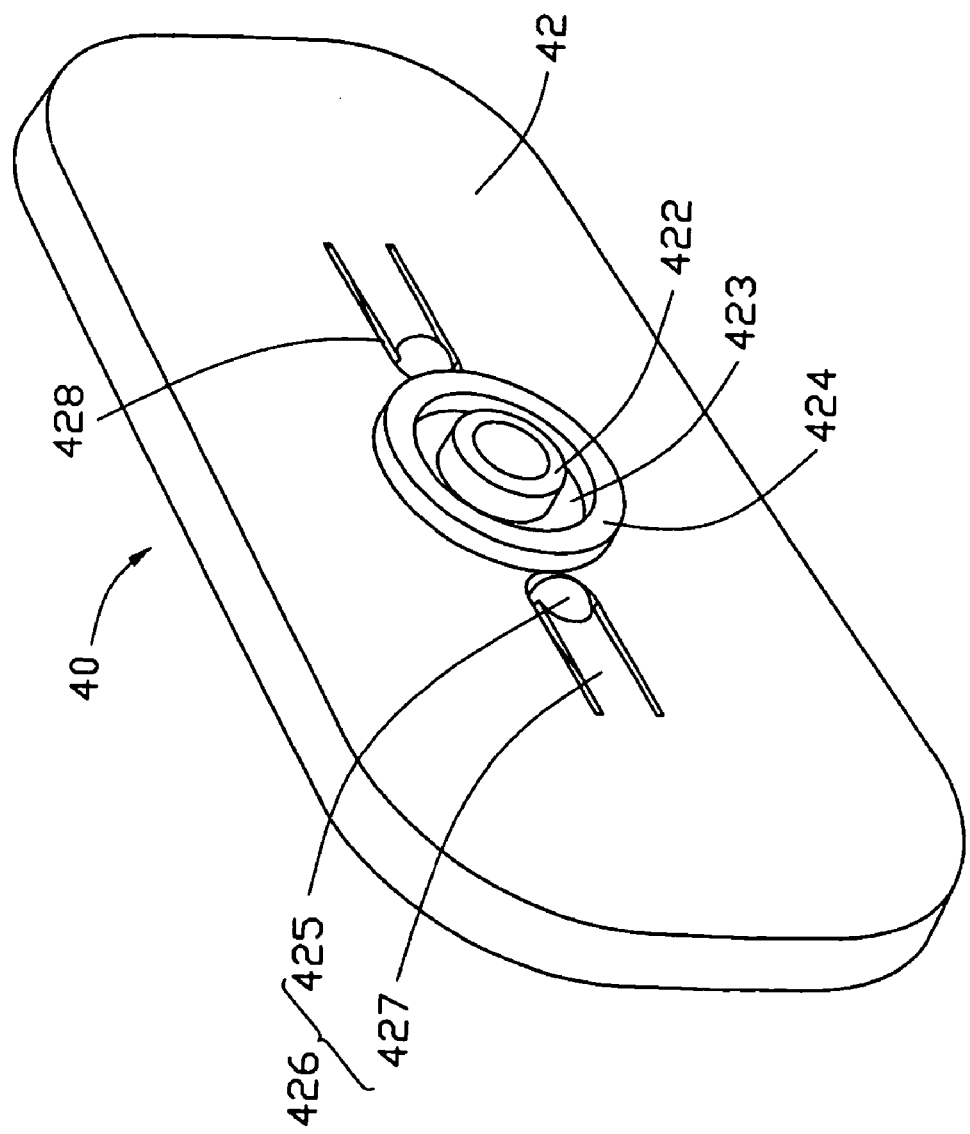
FIG. 4 is an enlarged view of the supporting member of the electronic device of FIG. 1, but viewed from another aspect.
Figure 5:
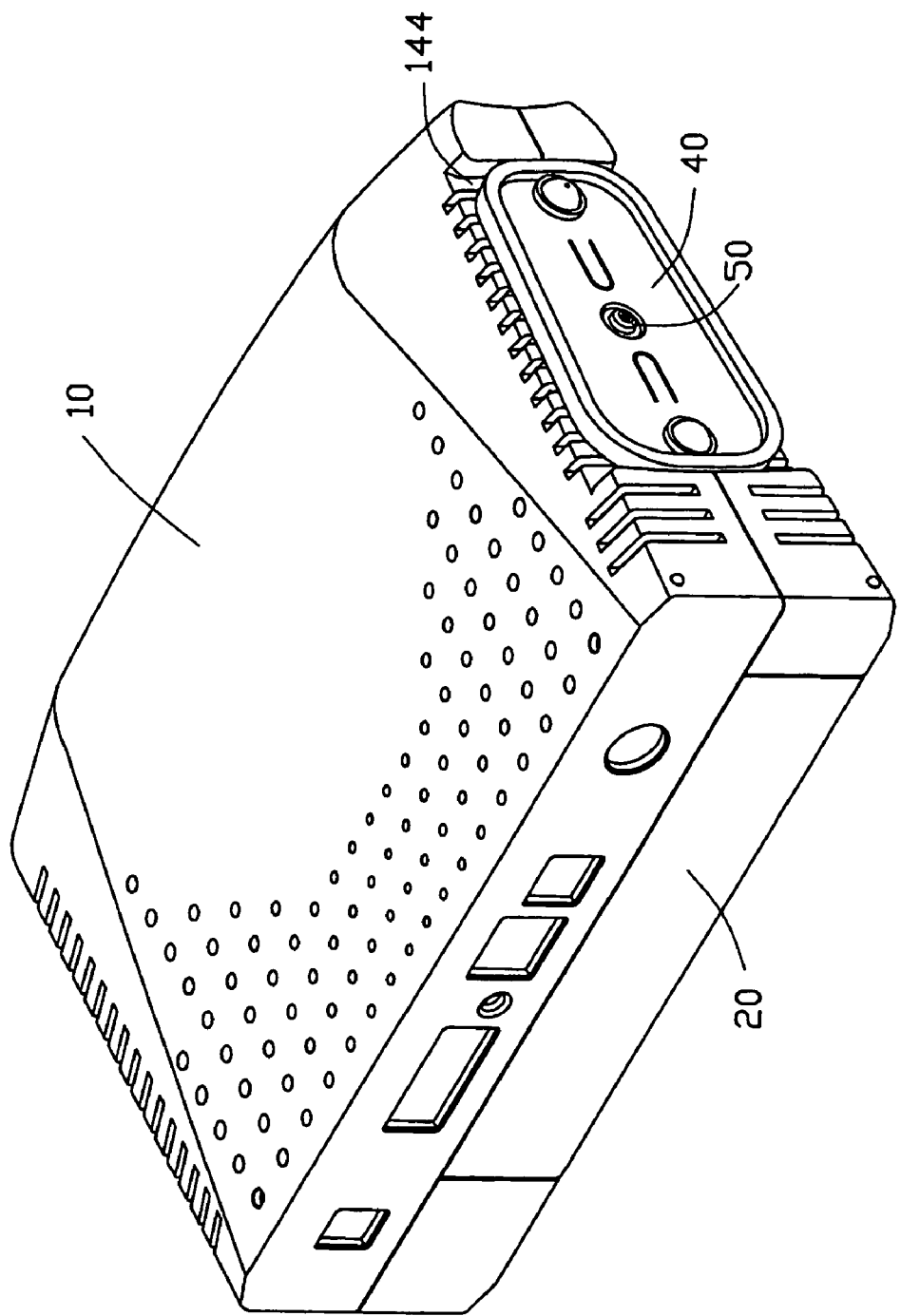
FIG. 5 is an assembled view of FIG. 1, showing the supporting member in a first position.

Referring to FIGS. 1 and 4, the supporting member 40 can be rotatably attached to the retaining portion 32. The supporting member 40 comprises a first face 42 and an opposite second face 44. A hollow first cylinder protrudes from a center of the first face 42, corresponding to the first groove 324 of the retaining portion 32. A hollow second cylinder 424 projects from the first face 42, corresponding to the second groove 326 of the retaining portion 32. The first and second cylinders 422, 424 are coaxial. A diameter of the first cylinder 422 is smaller than that of the second cylinder 424. A circular groove 423 is defined between the first cylinder 422 and the second cylinder 424. A pair of locating portions 426 is positioned on opposite sides of the second cylinder 424. Each locating portion 426 comprises an elastic finger 427, and a locating bulge 425 formed on a distal end of the elastic finger 427 and adjacent to the second cylinder 424. A gap 428 is defined in the supporting member 40 around each elastic finger 427, thereby allowing the locating portion 426 to resiliently deform. A mounting hole 440 is defined in a center of the second face 44. The mounting hole 440 and the first cylinder 422 are coaxial, and a diameter of the mounting hole 440 is greater than that of first cylinder 422. A pair of rounded protuberances 442 protrudes from opposite ends of the second face 44 respectively. In use, the protuberances 442 can prevent the supporting member 40 from sliding on a supporting surface such as a desktop.

Referring to FIGS. 1-5, in assembly, the receiving member 30 is received in the chamber 202 of the base 20. The cover 10 is installed on the base 20. The post 322 of the receiving member 32 is received in the first cylinder 422 of the supporting member 40. A fastener 50 is received through the mounting hole 440 and threadedly engaged in the hole 320 of the post 322. Thereby, the supporting member 40 is mounted to retaining portion 32 of the case 100. In this position, the socket 34 is received in the receiving portion 166. The neck 36 is received in the receiving hole 1660. The ribs 38 are received in the corresponding first and second slots 1662, 1664. The first and second cylinders 422, 424 of the supporting member 40 are respectively received in the first and second grooves 324, 326 of the retaining portion 32. Each of the locating bulge 425 of the supporting member 40 are received in a corresponding blind hole 329 of the retaining portion 32. The supporting member 40 is received in the recess 144 of the case 100, and is defined as being in a first position. The electronic device is oriented in a horizontal position.

Figure 6:
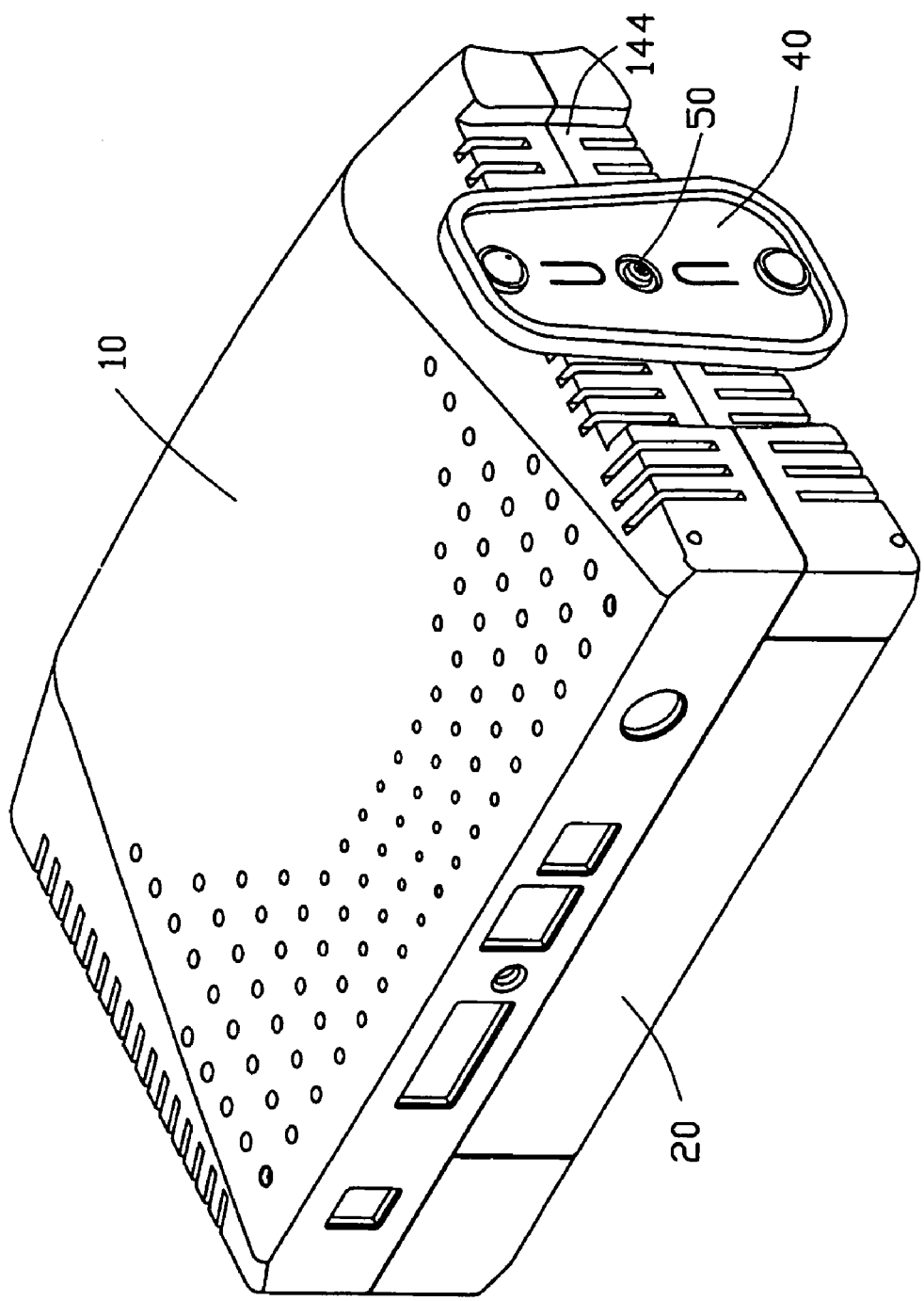
FIG. 6 is similar to FIG. 5, but showing the supporting member in a second position.

Referring also to FIG. 6, when the electronic device is to be used in an upright position, the supporting member 40 is rotated to a second position wherein the supporting member 40 is perpendicular to the recess 144 of the case 100. In the second position, each of the locating bulge 425 of the supporting member 40 is received in another corresponding blind hole 329 of the retaining portion 32. When the electronic device is standing upright on a surface such as a desk top, it is maintained in position not only by opposite ends of the first and second bottom walls 12, 22 but also by the transversely oriented supporting member 40. Thus the electronic device is stably located in the upright position.

Because the depth of each of the blind holes 329 is slightly greater than that of each of the slots 328, the locating bulge 425 of the supporting member 40 cannot slide out of the corresponding blind holes 329 of the retaining portion 32. Hence, the supporting member 40 is stably held in the selected first position or second position. Therefore the electronic device is stably maintained in either the horizontal position or the upright position.

When the electronic device is in the horizontal position, the supporting member 40 is fully received in the recess 144 of the case 100. Thus, the electronic device is more compact and aesthetically pleasing, and transportation and packaging of the electronic device is easier. Further, the production costs are decreased.

The protuberances 442 of the supporting member 40 can prevent the supporting member 40 from sliding on a supporting surface such as a desk top. Therefore the electronic device can have even greater stability in the upright position.

In alternative embodiments, the receiving member 30 may be omitted. In such cases, the retaining portion 32 may be positioned in either or both of the cover 10 and the base 20.

While various embodiments have been described above, it should be understood that they have been presented by way of example only and not by way of limitation. Thus the breadth and scope of the present invention should not be limited by the above-described exemplary embodiments, but should be defined only in accordance with the following claims and their equivalents.

I claim:

1. An electronic device comprising:
   a case comprising a receiving recess and a retaining portion provided in association with the recess, the retaining portion comprising at least one slot; and
   a supporting member mounted to the retaining portion, the supporting member comprising at least one locating portion slidable in the slot, a first cylinder protruding from a center thereof, and a second cylinder coaxial with the first cylinder;
   wherein each of the at least one locating portion comprises an elastic finger, and a locating protrusion provided at a distal end of the elastic finger and adjacent to the second cylinder.

2. The electronic device as claimed in claim 1, wherein the at least one locating portion is two locating portions, and a pair of gaps is defined in the supporting member, the gaps partly surrounding the locating portions respectively.

3. The electronic device as claimed in claim 1, wherein the case comprises a cover, a base, and a receiving member received between the cover and the base, and the retaining portion is provided in the receiving member.

4. The electronic device as claimed in claim 3, wherein the receiving recess comprises a first recess and a second recess, the cover comprises a first bottom wall, the base comprises a second bottom wall, the first recess is located in the first bottom wall, and the second recess is located in the second bottom wall.

5. The electronic device as claimed in claim 4, wherein the case comprises a receiving portion at the receiving recess, and the receiving portion comprises a first receiving portion located at the first recess, and a second receiving portion located at the second recess.

6. The electronic device as claimed in claim 5, wherein the receiving portion defines a receiving hole therein.

7. The electronic device as claimed in claim 6, wherein the receiving portion comprises a pair of vertical first slots and a pair of horizontal second slots, the first and second slots communicating with the receiving hole.

8. The electronic device as claimed in claim 7, wherein the retaining portion comprises a socket corresponding to the receiving portion, a neck corresponding to the receiving hole, and a plurality of ribs located at a periphery of the neck and corresponding to the first and second slots.

9. The electronic device as claimed in claim 8, wherein the socket comprises an post protruding from a center thereof, a first groove for receiving the first cylinder, a second groove for receiving the second cylinder; and the at least one slot is two slots, the post defining a threaded hole and being received in the first cylinder, and the second groove being located between the first groove and the slots.

10. An electronic device comprising:

a case comprising a receiving recess and a retaining portion provided in association with the receiving recess, the retaining portion comprising at least one slot; and a supporting member mounted to the retaining portion and comprising at least one locating portion slidable in the slot, a first cylinder protruding from a center thereof, and a second cylinder coaxial with the first cylinder; and each of the at least one locating portion comprising an elastic finger, and a locating protrusion provided at a distal end of the elastic finger and adjacent to the second cylinder;

wherein when the electronic device is in a horizontal position, the supporting member is received in the receiving recess of the case; when the electronic device is in an upright position, the supporting member is perpendicular to the receiving recess of the case.

11. The electronic device as claimed in claim 10, wherein the at least one locating portion is two locating portions and a pair of gaps is defined in the supporting member, the gaps partly surrounding the locating portions respectively.

12. The electronic device as claimed in claim 10, wherein the retaining portion comprises an post protruding from a center thereof, a first groove for receiving the first cylinder, and a second groove for receiving the second cylinder; and the at lest one slot is two slots, the post defining a threaded hole and being received in the first cylinder, and the second groove being located between the first groove and the slots.

13. The electronic device as claimed in claim 12, wherein a depth of the second groove is less than that of the first groove, and greater than that of each of the slots.

14. The electronic device as claimed in claim 12, wherein a pair of blind holes are defined in opposite ends of each of the slots, a depth of each of the blind holes is slightly greater than that of each of the slots, and the blind holes are for receiving the locating protrusions of the supporting member.

15. An electronic device comprising:

a case of said electronic device comprising a base and a cover separately formed from said base mechanically engagable with each other so as to encloses components of said electronic device therein together, said case defining a side thereof jointly formed by a part of said base and a part of said cover, and capable of abutting against a supporting surface for placing said electronic device thereon along a predetermined orientation of said electronic device, a receiving member disposed between said base and said cover for locating said components of said electronic device in said case, a socket formed from said receiving member neighboring said side of said case capable of extending through said side of said case so as to be exposable outside said case; and a supporting member removably attachable to said socket along said side of said case so as to be movable relative to said case between a first position thereof where said supporting member snugly abuts against said side of said case, and a second position thereof where portions of said supporting member move away from said side of said case so as to enlarge an abutting area of said side of said case against said supporting surface for steady placement of said electronic device thereon; wherein said supporting member comprises at least one location portion, a first cylinder protruding from a center thereof, and a second cylinder coaxial with the first cylinder, and said at least one location portion adjacent to said second cylinder.

16. The electronic device as claimed in claim 15, wherein each of said at least one locating portion comprising an elastic finger, and a locating protrusion provided at a distal end of said elastic finger to slide in a slot of said socket.

17. The electronic device as claimed in claim 16, wherein a gap is defined in said supporting member to partly surround said elastic finger.

* * * * *